United States Patent [19]

Milkovic

[11] 4,032,798

[45] June 28, 1977

[54] LOW CUTOFF DIGITAL PULSE FILTER ESPECIALLY USEFUL IN ELECTRONIC ENERGY CONSUMPTION METERS

[75] Inventor: Miran Milkovic, Scotia, N.Y.

[73] Assignee: General Electric Company

[22] Filed: Nov. 14, 1975

[21] Appl. No.: 631,968

Related U.S. Application Data

[62] Division of Ser. No. 505,799, Sept. 13, 1974.

[52] U.S. Cl. .......................... 307/233 R; 307/255; 307/251; 328/138; 307/205; 307/214; 307/362; 307/279

[51] Int. Cl.² .................... H03K 9/06; H03K 3/286

[58] Field of Search ........... 328/138, 140; 307/233, 307/279, 288, 291, 205, 251, 255, 235 T, 279

[56] References Cited

UNITED STATES PATENTS

| | | | |
|---|---|---|---|
| 2,716,189 | 8/1955 | Ayres | 328/138 X |
| 3,305,732 | 2/1967 | Grossman et al. | 328/138 X |
| 3,413,490 | 11/1968 | Breunig et al. | 307/233 |
| 3,509,379 | 4/1970 | Rapp | 307/288 X |
| 3,555,434 | 1/1971 | Sheen | 328/140 X |
| 3,882,331 | 5/1975 | Sasaki | 307/290 X |

Primary Examiner—John S. Heyman

[57] ABSTRACT

A digital electrical pulse filter which provides output electrical pulses directly corresponding to input electrical pulses when the input pulses have a repetition rate greater than a predetermined repetition rate and which provides no output pulses when the input pulses have a repetition rate less than the predetermined repetition rate. An electronic energy consumption meter employing such a low cutoff digital pulse filter is also disclosed as well as a specific circuit for the filter employing complementary pairs of C-MOS active elements in an arrangement which facilitates construction of the entire filtering circuit according to C-MOS integrated circuit construction techniques and which enhances the overall operation of such an integrated circuit filter.

14 Claims, 4 Drawing Figures

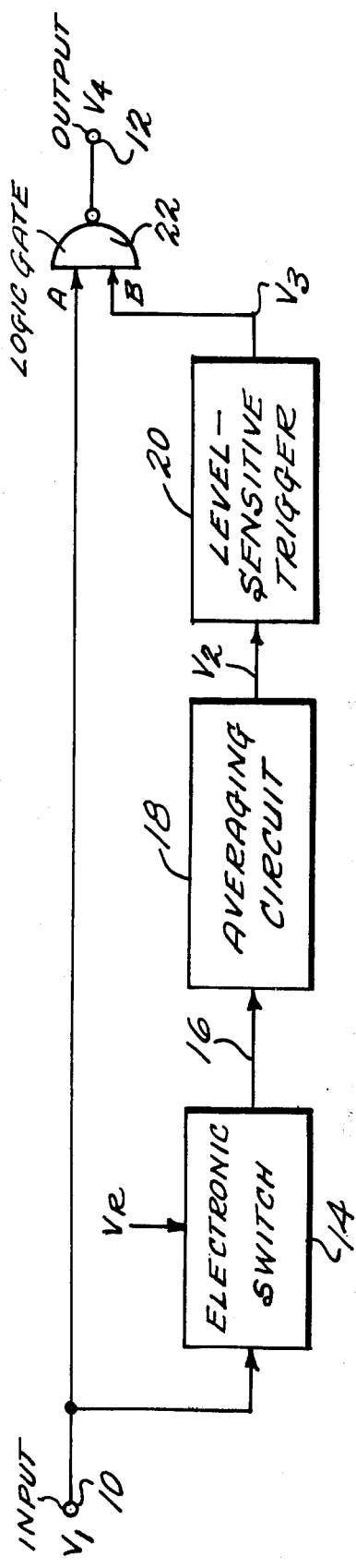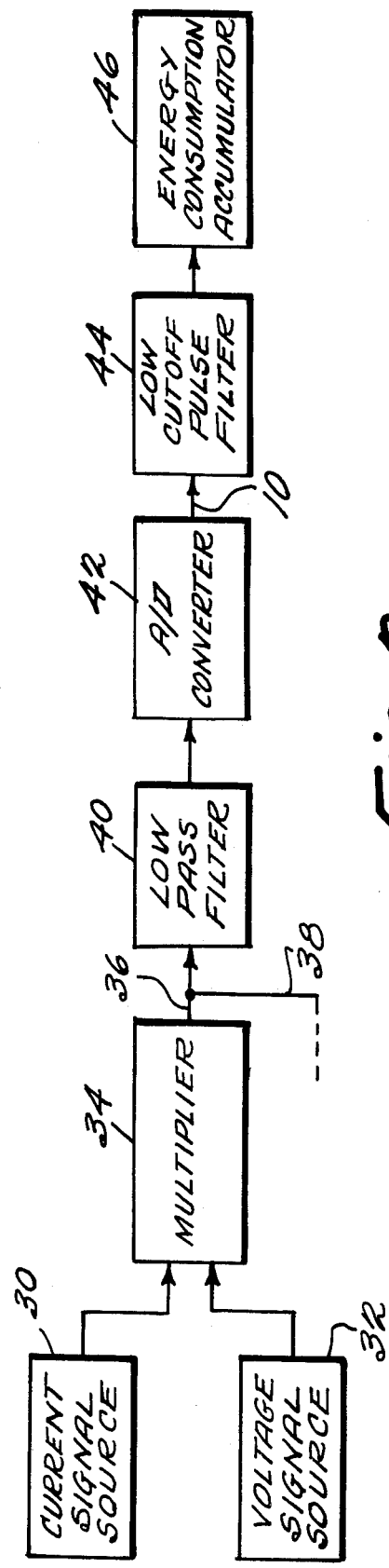

LOW CUTOFF DIGITAL PULSE FILTER ESPECIALLY USEFUL IN ELECTRONIC ENERGY CONSUMPTION METERS

This is a division of application Ser. No. 505,799, filed Sept. 13 1974.

This invention relates to an improvement in electronic energy consumption meters and, more particularly, to a digital electrical pulse filter having a low frequency cutoff characteristic that is especially useful in electronic energy consumption meters.

The general structure and characteristics of electronic energy consumption meters is provided in detail in my earlier copending U.S. applications, Ser. No. 361,030 filed May 17, 1973 and Ser. No. 395,142, filed Sept. 7, 1973. The entire disclosure of these earlier copending applications is hereby incorporated by reference. The entire right, title and interest in and to the inventions described in the aforesaid patent applications and the entire right, title and interest in and to the invention herein disclosed, as well as in and to the patent application of which this specification is a part, are assigned to the same assignee.

The electronic energy consumption meter as described in my earlier copending applications basically involves the analog multiplication of signals representing electrical voltage and current variables to produce an analog signal representative of instantaneous power consumption in an electrical circuit. Such a power consumption signal is then converted to digital form whereby an electrical pulse is produced every time a predetermined unit of energy is consumed. Accordingly, the repetition rate of the resulting digital pulse train is proportional to power consumption while the accumulated number of such pulses in the train is proportional to total energy consumption. However, at very low power consumption rates the output from the analog to digital converter may be in error. Accordingly, it is desired to ignore pulses in the digital pulse train which recur at a repetition rate less than some predetermined value. To this end, I have now provided an improved form of low cutoff pulse filter unit for the energy consumption meters disclosed in my earlier referenced copending applications. For instance, the details of the low cutoff pulse filter unit 66 disclosed in my copending application Ser. No. 361,030 are disclosed in FIGS. 28 and 30 as explained on pages 26–27 of the specification of that application.

The present invention provides an improved low cutoff pulse filter unit and hence an improved overall electronic energy consumption meter of the general type described in my earlier referenced copending applications.

The digital electrical pulse filter of this invention provides output electrical pulses directly corresponding to input electrical pulses when the input pulses have a repetition rate greater than a predetermined repetition rate. However, the filter provides no output pulses when the input pulses have a repetition rate less than the predetermined repetition rate.

According to this invention, the input pulses to the filter are passed to the output by a logic gate only when that logic gate is enabled by an enabling signal. This enabling signal is, in turn, produced at the output of a level sensitive trigger circuit which is controlled by an averaged signal representing a relatively short-term average of the number of input pulses per unit time (i.e. the repetition rate). Accordingly, when the repetition rate of the input pulses reaches some predetermined value, this averaged signal will have sufficient magnitude to trigger the level sensitive trigger and to thus enable the logic gate to provide output pulses corresponding directly to the input pulses. On the other hand, when the repetition rate of the input pulses falls below the predetermined repetition rate, the magnitude of the averaged signal will fall below the magnitude necessary to trigger the level sensitive trigger thus removing the enabling signal from the logic gate and blocking the flow of pulses from the filter output.

The possible effect of variations in the amplitude of input pulses to the filter on the overall filter operation is minimized by using the input signal only to control an electronic switch, which, in turn, controls the application of a reference voltage or other source of electrical energy to a short-term storage and dissipation or averaging circuit. In the preferred embodiment, a reference voltage source is switched by the input pulses to charge an RC network. The average or DC component of the voltage appearing at the output of this RC network is then proportional to the repetition rate of the input pulses and is utilized for triggering the level sensitive trigger circuit.

Since the RC network in the preferred embodiment receives an impulse of input energy in response to each input pulse occurrence, there will be a certain AC component or "ripple voltage" also present and superposed on the average or DC component at the output of the RC filter. To prevent possible jitter of the level sensitive trigger circuit due to this ripple voltage component when operating near the cutoff frequency of the filter, a special regenerative trigger circuit having bistable characteristics is employed. In effect, this special regenerative trigger circuit has a switching hysteresis characteristic of such a magnitude that the normally expected magnitude of ripple voltage at the RC network output will not cause jitter at the output of the trigger circuit.

In addition, the exemplary and preferred embodiment of this invention incorporates pairs of complementary C-MOS active elements which greatly facilitates the construction of the entire filter circuit using C-MOS integrated circuit construction techniques. Furthermore, the preferred exemplary embodiment is arranged to enhance the operation of such an integrated circuit C-MOS structure.

These and other objects and advantages of the invention will be better appreciated by reading the following detailed disclosure of the invention in conjunction with the accompanying drawings, of which:

FIG. 1 is a generalized block diagram of the digital electrical pulse filter of this invention;

FIG. 2 is a generalized block diagram of an improved electronic consumption meter according to this invention employing the low cutoff digital pulse filter shown in FIG. 1;

Figure 3:
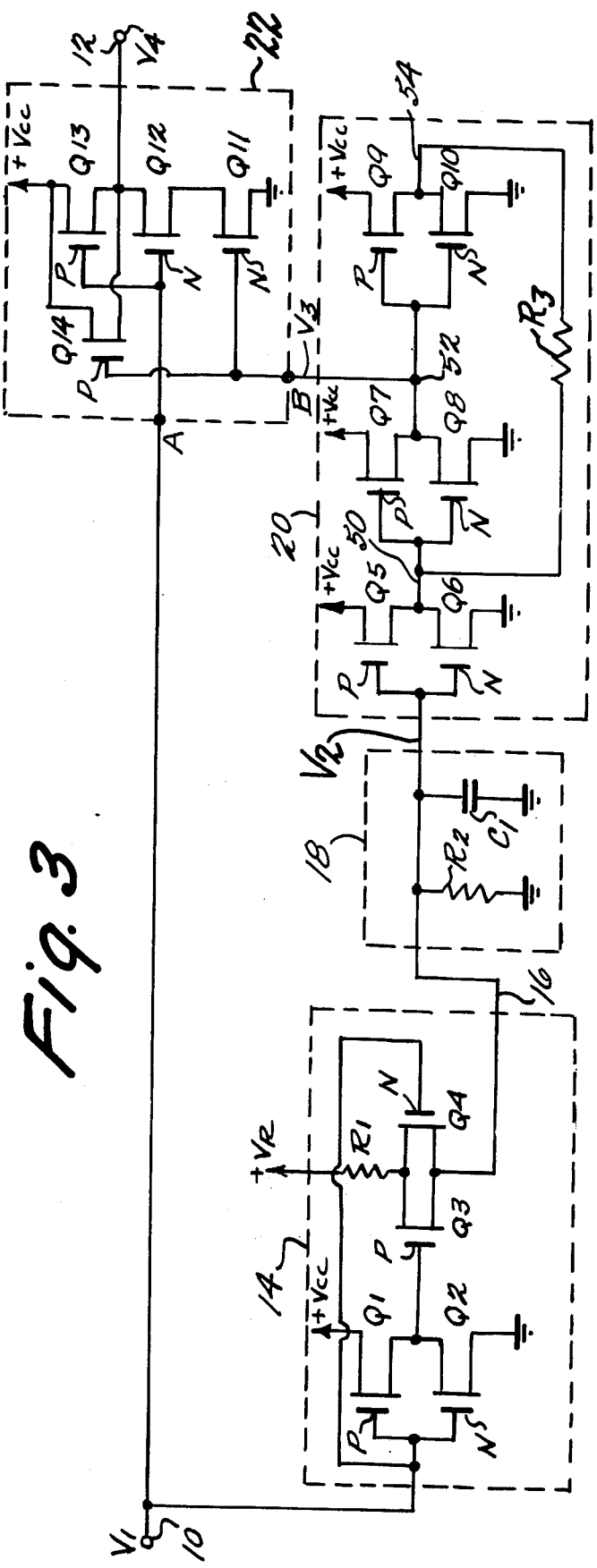
FIG. 3 is a detailed circuit diagram of a preferred exemplary embodiment for the improved digital electrical pulse filter shown in FIG. 1.

The improved filter of this invention is shown generally in FIG. 1. Digital input pulses having a variable repetition rate are provided at an input 10. The digital output pulse train appearing at the output 12 has exactly the same repetition rate as the input pulse train so long as that repetition rate is above some predetermined value. If the input pulse train at 10 has a repetition rate below that predetermined value, then no output pulses at all are provided at 12.

In the electronic energy consumption meters described in my earlier referenced copending applications, the input pulse rates may typically vary from 20 Hz to 4 KHz and a typical desired cutoff frequency for the filter of FIG. 1 would be, for example, 35 Hz. Accordingly, as may be seen in FIG. 4, the input pulse train $V_1$ presented to the input 10 may comprise a first segment of pulses having a width $T_1$ and spaced at intervals $T_2$ such that the frequency $f$ or repetition rate is greater than the predetermined cutoff value (e.g., 35 Hz). On the other hand, the same input pulse train may have another segment occurring at a later time (after $t'$) wherein the interpulse intervals $T_2$ are so greatly increased that the frequency or repetition rate of such pulses falls below the predetermined value (e.g., 35 Hz).

The input pulse train applied to 10 is applied to control an electronic switch 14 which, in response to each input pulse, provides an impulse of electrical energy at its output 16 from a source such as the reference voltage $V_R$ shown in FIG. 1. These impulses of energy appearing on line 16 in response to each input electrical pulse at 10 are averaged over a relatively short term interval by an averaging circuit 18 which actually constitutes an energy storage and dissipation means for storing the energy presented at input 16 for a short term and eventually dissipating such stored energy at a predetermined rate thus providing an average signal $V_2$ at its output representing the amount of energy stored at any given time, and, hence, having a DC component proportional to the repetition rate of the input pulses appearing at terminal 10.

The averaged signal $V_2$ having a DC component proportional to the repetition rate of the iput pulses is then presented to the input of a level sensitive trigger circuit 20. The trigger circuit 20 has two stable states. One state provides an enabling signal to the second input B of the logic gate 22 and the other state does not provide such an enabling signal. The trigger 20 is switched between its two possible output states in dependence upon the level of the input signal $V_2$. When $V_2$ rises above a predetermined trigger level, then the output signal $V_3$ from the trigger circuit 20 changes states to provide an enabling signal to the input B of the logic gate 22 thus enabling the logic gate 22 to pass the input pulses from 10 applied thereto through input A of the logic gate.

Figure 4:
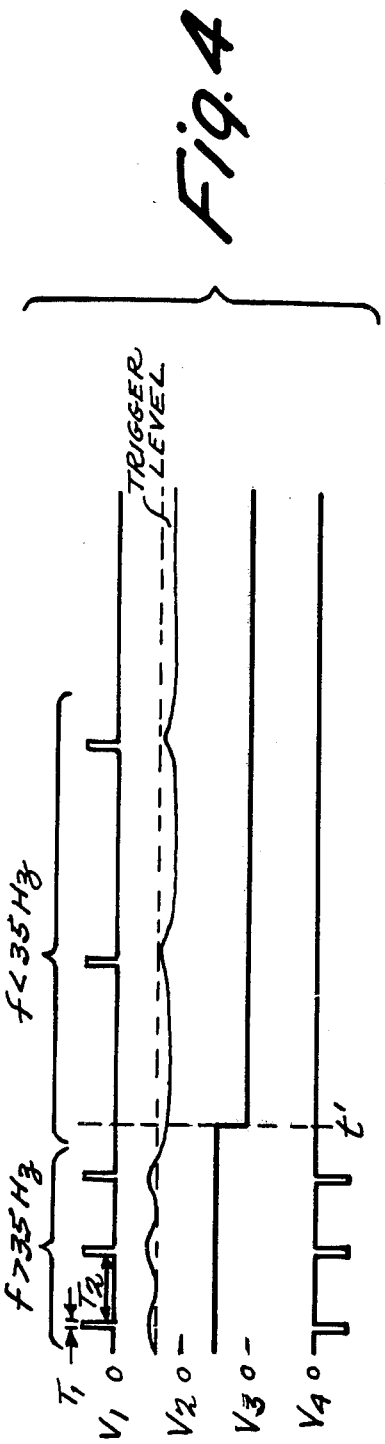
FIG. 4 is a set of wave form diagrams useful in explaining the operation of the circuitry shown in FIG. 3.

Accordingly, as shown in FIG. 4, the averaged signal $V_2$ has a DC component which varies with the frequency or repetition rate of the input pulses $V_1$. When the DC component of $V_2$ falls below the trigger level, such as at time $t'$ shown in FIG. 4, the output $V_3$ from the trigger circuit 20 falls to a low level, thus disabling the logic gate 22 and preventing the appearance of any further output pulses $V_4$. However, prior to $t'$, the DC component of $V_2$ is above the trigger level thus causing the output $V_3$ of the trigger 20 to have a high voltage level which, in turn enables the logic gate 22 via input B to pass output pulses $V_4$ corresponding directly to the input electrical impulses at terminal 10.

A block diagram of the improved electronic energy consumption meter according to this invention is shown in FIG. 2. Here, analog variables from a current signal source 30 and a voltage signal source 32 are multiplied in a multiplier 34 to provide an output analog signal at 36 having a component representative of the instantaneous power consumption in an electrical circuit having current and voltage flowing therein as represented by the current and voltage variables produced by the sources 30 and 32, respectively. As explained in my earlier referenced copending applications, similar analog signals can be produced at the output of other multipliers corresponding to other phase of a multiphase electrical circuit, etc. In this latter instance, such further signals would be presented as at 33 and added to the output of multiplier 34. Typically, in the preferred embodiment, the multiplier 34 constitutes a time division type of four quadrant multiplier which produces a signal at 36 having a DC component proportional to the instantaneous power consumption and a higher frequency AC component which is to be disregarded. Accordingly, it is usually desirable to include a low pass filter 40 or its equivalent function to insure that only the desired DC compoent of the multiplier output at 36 is passed on to an A/D converter 42. The A/D converter 42, as explained in my earlier referenced copending applications, effectively integrates the DC component of the multiplier output and produces an output pulse from the A/D converter each time a predetermined unit of energy has been consumed. It is these pulses from the A/D converter 42 which are then presented to the input 10 of the low cutoff digital pulse filter 44. The internal structure of the filter 44 is shown in FIGS. 1 and 3. Below some minimum power consumption level, the output from the A/D converter 42 may become erroneous such that pulses are produced after long intervals of time even though no power is being consumed. To prevent such errors from accumulating in the overall measurement of energy consumption, the low filter 44 is provided to insure that only pulses above a predetermined repetition rate from the A/D converter 42 are passed on to an energy consumption accumulator 46. Thus, the digital filter 44 according to this invention is one which provides absolutely no output pulses at its output 12 unless the input pulses at 10 rise above a predetermined repetition rate. However, when this predetermined repetition rate is met or exceeded, then the output at 12 from the filter 44 corresponds exactly with the input at 10 such that there is a one-to-one correspondence between such input and output pulses above the predetermined repetition rate.

A detailed circuit diagram for the preferred exemplary embodiment of the digital pulse filter according to this invention is shown in FIG. 3. The circuit is formed mostly from active elements which can be readily produced in integrated circuit form according to C-MOS integrated circuit construction techniques. As shown in FIG. 3, the circuit comprises active elements $Q_1$ - $Q_{14}$ wherein half of the elements are of the P-channel type of MOS transistors (signified by a "P" reference character in FIG. 3) and the other half of the active elements are N-channel type of MOS transistors (signified by a "N" reference character in FIG. 3).

In the preferred exemplary embodiment, the electronic switch 14 actually comprises an inverter ($Q_1$ and $Q_2$) in combination with a complementary pair of electronic switches ($Q_3$ and $Q_4$). In the normal or quiescent condition, the voltage $V_1$ is low thus causing $Q_2$, $Q_3$ and $Q_4$ to be normally "off" while $Q_1$ is normally "on". When $V_1$ is raised to a high level, such as during the duration of an input pulse, $Q_1$ is turned "off" while $Q_2$.

$Q_3$ and $Q_4$ are all turned "on". The net result is that the reference voltage $V_R$ is connected through resistor $R_1$ to the output 16 of the switch for the duration $T_1$ of each input pulse appearing at input 10. It should be appreciated that a simpler form of controlled electronic switch might be utilized for performing this function. However, the preferred embodiment just described has a preferred switching characteristic in that C-MOS elements $Q_3$ and $Q_4$ of opposite polarity types are connected in parallel to perform the switching functions.

The energy storage and dissipation means or averaging circuit 18 and the preferred embodiment comprise resistor $R_2$ and capacitor $C_1$ connected in parallel as shown in FIG. 3. As should be appreciated, the capacitor $C_1$ acts as an energy storage element for storing the energy impulses presented over line 16 while the resistor $R_2$ acts as a dissipation means which dissipates the energy stored in capacitor $C_1$ at a predetermined rate. Accordingly, the voltage $V_2$ appearing at the output of the averaging circuit 18 will represent the amount of energy stored at any given time in capacitor $C_1$. As should now be appreciated, the average or DC component of such stored energy will be proportional to the number of input pulses per unit time assuming that each input pulse is of uniform duration. In other words, the DC compoent of voltage $V_2$ will be proportional to the repetition rate of input pulses $V_1$ appearing at 10.

The level sensitive trigger circuit 20 shown in FIG. 3 comprises three serially connected inverters: $Q_5$, $Q_6$; $Q_7$, $Q_8$; and $Q_9$, $Q_{10}$. Each inverter (such as $Q_5$ and $Q_6$) comprises a pair of complementary type C-MOS active elements with the inputs (gates) being controlled in common and with the controlled leads (source-drain) being connected in series. It requires approximately one-half the supply voltage $+V_{CC}$ to switch such an inverter element so that this is the approximate threshold level of the trigger circuit 20. When $V_2$ is below this threshhold level, $Q_5$ is "on" while $Q_6$ is "off". This presents a "high" level at 50 which, in turn, becomes a "low" level at 52 and, in turn a "high" level at 54. The "low" level present at 52 is taken as the output $V_3$. As will be explained in more detail below, such a low output disables the logic gate (NAND) circuit 22. When the input voltage $V_2$ increases above the trigger level (approximately ½ $+V_{CC}$), then $Q_6$ switches "on" causing the level at point 50 to go "low" which, in turn, produces a "high" level at 52 and a "low" level at 54 as should now be apparent. As will also be explained in further detail below, a "high" signal at $V_3$ presented to the B input of NAND gate 22 will enable this gate to pass pulses from the input 10 to the output 12 of the filter circuit.

As shown in FIG. 3, the voltage $V_2$ in the exemplary embodiment will have some AC ripple component. As will be appreciated, unless some steps are taken to eliminate the possible influence of such a ripple component on the trigger circuit 20, such a ripple component might produce jitter at the output signal $V_3$ of the trigger circuit when $V_2$ is at a level approximating the trigger level. In the preferred exemplary embodiment, the possible jitter problem is overcome by causing the trigger 20 to have a switching hysteresis characteristic greater than the expected ripple component. The preferred embodiment for achieving this hysteresis switching characteristic is the provision of positive feedback via positive feedback resistor $R_3$ coupled from the output of the third inverter ($Q_9$, $Q_{10}$) to the input of the preceding or second inverter ($Q_7$, $Q_8$) as shown in FIG. 3. The exact value for $R_3$ may, of course, vary within considerable limits so long as the amount of positive feedback is sufficient to avoid the potential jitter in the output voltage $V_3$.

When $V_3$ is low, the input B to NAND gate 22 causes $Q_{11}$ to remain in its "off" condition and $Q_{14}$ to be in its "on" state, thus causing the output voltage $V_4$ at 12 to be "high" (approximately $+V_{CC}$) regardless of what pulses may be presented at input A of the NAND gate 22. On the other hand, when the voltage $V_3$ goes "high" at the input B of NAND gate 22, then $Q_{11}$ is constantly "on" and $Q_{14}$ is turned "off". This permits transistor $Q_{12}$ to be turned "on" and $Q_{13}$ to be turned "off" in response to each input pulse appearing at 10 while $Q_{12}$ and $Q_{13}$ have opposite "off" and "on" states respectively in the absence of such pulses. Accordingly, as should now be appreciated, an output train of pulses $V_4$ will be produced at 12 which directly corresponds to the input train of pulses $V_1$ so long as the repetition rate of the input pulses is above the predetermined threshold value. Whenever the repetition rate of the input pulses at $V_1$ falls below this predetermined value, then no pulses at all will appear at the output 12 of the filter.

In the preferred exemplary embodiment the input pulse train consists of pulses of a constant width of about 60 $\mu$sec at a variable pulse rate of 20 Hx to 4kHz. The input pulses are fed to one input of the two input NAND gate formed by the MOS transistors $Q_{11}$ to $Q_{14}$. Input B of NAND gate 22 is controlled by a regenerative trigger circuit formed by transistors $Q_5$ to $Q_{10}$ and resistor $R_3$ respectively. The output voltage $V_3$ has thus only two states; it is equal to zero or $+V_{CC}$ when the voltage $V_2$ approaches ½ $V_{CC}$, which is the approximate threshold level of the trigger circuit. The voltage $V_2$ is developed across $R_2$ and $C_1$ by charging pulses through the analog switch $Q_3$ and $Q_4$, resistor $R_1$ and the reference voltage $V_R$. The switch itself is controlled by the input pulse train and the inverter $Q_1$ and $Q_2$.

The threshold frequency $f_{1T}$ can be calculated for $T_2 >> T_1$ from:

$$f_{1T} \approx \frac{1}{T_1 \left( \frac{V_R}{V_T} - 1 \right) \frac{R_2}{R_1}} \qquad (1)$$

Here $T_1$ is the individual input pulse length or duration, $V_R$ is a constant reference voltage. $V_T$ is the threshold voltage of the regenerative trigger circuit (usually $V_{CC/2}$) The ripple voltage $\Delta V_2$ across $C_1$ at $f_{1T}$ can be calculated for $T_2 >> T_1$ from:

$$\Delta V_2 \approx \frac{V_R - V_T}{R_2} \left( \frac{1}{f_{1T} \cdot C_1} \right) \qquad (2)$$

For $R_2 = 2M$, $R_1 = 4K\Omega$, $VR/V_T = 2$, $T_1 = 60\mu s$ and $T_2 = 1/f_{1T}$ one gets $f_{1T} = 35H_z$ and $\Delta V_2 = 15mV$. ($C_1 = 1\mu f$).

While only one detailed exemplary embodiment of this invention has been described, those skilled in the art will recognize that it will be possible to modify many features of this exemplary embodiment without departing from the improved teachings and features of this invention. Accordingly, all such modifications are intended to be incorporated within the scope of this invention as defined in the appended claims.

What is claimed is:

1. A digital electrical pulse filter which provides output electrical pulses directly corresponding to input electrical pulses when the input pulses have a repetition rate greater than a predetermined repetition rate and which provides no output pulses when the input pulses have a repetition rate less than said predetermined repetition rate, said filter comprising:

logic gate means having a first input connected to respond to said input electrical pulses, a second input and an output for providing said output electrical pulses only when enabled by an enabling signal applied to said second input;

energy storage and dissipation means connected for short term storage and eventual dissipation at a predetermined rate of electrical energy applied thereto and for providing an averaged signal representing the amount of energy stored at any given time;

a source of electrical energy;

switch means including a pair of complementary C-MOS active switch elements having opposite polarities connected between said source and said energy storage and dissipation means, said switch elements being controlled by said input electrical pulses to provide input pulses of energy to said energy storage and dissipation means corresponding to the occurrences of said input electrical pulses whereby the value of said averaged signal corresponds to the repetition rate of said input electrical pulses; and trigger circuit means connected to receive said averaged signal and to provide said enabling signal to the second input of said logic gate only during the time when said averaged signal exceeds a predetermined threshold value corresponding to said predetermined repetition rate.

2. A digital electrical pulse filter as in claim 1 wherein said switch means further includes inverter means connected for inverting the polarity of said input electrical pulses whereby said switch elements of opposite polarities are separately controlled by said input electrical pulses and by the inverted electrical pulses respectively.

3. A digital electrical pulse filter as in claim 1 wherein said energy storage and dissipation means comprises a capacitive and resistive element.

4. A digital electrical pulse filter as in claim 2 wherein said inverter means comprises a pair of series connected complementary C-MOS active elements having opposite polarities, and being controlled by said input electrical pulses with the inverted polarity electrical pulses being provided at the series connection between the active elements.

5. A digital electrical pulse filter as in claim 1 wherein said trigger circuit means comprises:

a bistable circuit having a switching hysteresis characteristic which precludes jitter in the enabling signal that might otherwise be caused by short term fluctuations or ripple in the averaged signal.

6. A digital electrical pulse filter as in claim 5 wherein said bistable circuit includes positive feedback means providing said switching hysteresis characteristic.

7. A digital electrical pulse filter as in claim 6 wherein said bistable circuit and said positive feedback means comprise:

a plurality of serially connected inverter circuits with an electrical feedback path extending from the output of one such inverter back to the input of a preceeding inverter 8. A digital electrical pulse filter as in claim 7 wherein said feedback path comprises a resistive element.

9. A digital electrical pulse filter as in claim 7 wherein said inverter circuits each comprise a pair of series connected complementary C-MOS active elements having opposite polarities, both elements being controlled by a common input and providing an output at the series connection between controlled leads of the active elements.

10. A digital electrical pulse filter which provides output electrical pulses directly corresponding to input electrical pulses when the input pulses have a repetition rate greater than a predetermined repetition rate and which provides no output pulses when the input pulses have a repetition rate less than said predetermined rate, said filter comprising:

logic gate means having a first input connected to respond to said input electrical pulses, a second input and an output for providing said output electrical pulses only when enabled by an enabling signal applied to said second input;

energy storage and dissipation means connected for short term storage and eventual dissipation at a predetermined rate of electrical energy applied thereto and for providing an averaged signal representing the amount of energy stored at any given time;

a source of electrical energy;

switch means including, an inverter means connected for inverting the polarity of said input electrical pulses, and a pair of complementary C-MOS active switch elements having opposite polarities connected between said source and said energy storage and dissipation means, said switch elements of opposite polarities being separately controlled by said input electrical pulses and by the inverted electrical pulses respectively to provide input pulses of energy to said energy storage and dissipation means corresponding to the occurrence of said input electrical pulses whereby the value of said averaged signal corresponds to the repetition rate of said input electrical pulses; and trigger circuit means, including a bistable circuit connected to receive said averaged signal and to provide said enabling signal to the second input of said logic gate, said bistable circuit having a switching hysteresis characteristic which precludes jitter in the enabling signal caused by short term fluctuations or ripple in the average signal and providing said enabling signal only during the time when said averaged signal exceeds a predetermined threshold value corresponding to said predetermined repetition rate.

11. A digital electrical pulse filter as in claim 10 wherein said bistable circuit includes positive feedback means providing said switching hysteresis characteristic.

12. A digital electrical pulse filter as in claim 11 wherein said bistable circuit and said positive feedback means comprise:

a plurality of serially connected inverter circuits with an electrical feedback path extending from the output of one such inverter back to the input of a preceeding inverter.

13. A digital electrical pulse filter as in claim 12 wherein said feedback path comprises a resistive element.

14. A digital electrical pulse filter as in claim 13 wherein all of said inverter circuits each comprise a pair of series connected complementary C-MOS active elements having opposite polarities, both elements being controlled by a common input and providing an output at the series connection between controlled leads of the active elements.

* * * * *